United States Patent [19]

Seliger et al.

[11] 4,301,391
[45] Nov. 17, 1981

[54] DUAL DISCHARGE PLASMA DEVICE

[75] Inventors: Robert L. Seliger, Agoura; Laurence C. Dumage, Simi Valley, both of Calif.

[73] Assignee: Hughes Aircraft Company, Culver City, Calif.

[21] Appl. No.: 33,344

[22] Filed: Apr. 26, 1979

[51] Int. Cl.³ .......................... H01J 7/24; H05B 31/26
[52] U.S. Cl. .......................... 315/111.31; 315/111.21; 313/231.41
[58] Field of Search ................ 315/111, 111.2, 111.3, 315/111.8, 111.9; 313/231.3, 231.4, 362

[56] References Cited

U.S. PATENT DOCUMENTS

| | | | |
|---|---|---|---|
| 3,323,002 | 5/1967 | Lafferty | 313/231.4 |
| 3,343,027 | 9/1967 | Frohlich | 313/231.4 |
| 3,515,932 | 6/1976 | King | 313/231.4 |
| 3,890,535 | 6/1975 | Gautherin et al. | 313/362 |
| 3,924,134 | 12/1975 | Uman et al. | 313/362 |

Primary Examiner—Alfred E. Smith
Assistant Examiner—Thomas P. O'Hare
Attorney, Agent, or Firm—Allen A. Dicke, Jr.; W. H. MacAllister

[57] ABSTRACT

The first plasma discharge chamber of the dual discharge plasma device contains an electron emitter and a first anode and contains gas at a sufficiently high pressure that the discharge voltage in the first chamber is below the sputtering threshold. The second chamber has a main anode and receives a plume of plasma from the first chamber. The main anode operates at a voltage above the sputtering threshold with a respect to the first anode and the gas in the second chamber is at a low enough pressure for a conventional low pressure plasma discharge which is used as an ion source.

10 Claims, 2 Drawing Figures

DUAL DISCHARGE PLASMA DEVICE

BACKGROUND OF THE INVENTION

This invention is directed to a plasma device having a cathode structure having a high pressure region around the emitting surface of a barium impregnated cathode. Plasma in the cathode region protrudes and couples to a main plasma discharge operating at lower pressure and higher voltage.

The prior art includes the hollow cathode wherein tantalum foil is coated with emissive material which initialy comprises a mixture of barium carbonate and strontium carbonate. The foil is rolled and inserted into a cathode tube. An encapsulated heater is positioned around the tube and a cathode orifice is located at the end of the tube. Vapor flow through the cathode, for example mercury vapor, passes through the rolled foil and out of the cathode orifice. The hollow cathode has some problems. One problem is the dependence on low work function emission from the coated foil insert. Upon first heating the carbonates convert to oxides which are anhydrous and absorb water vapor when exposed to air. While this is a reversible process, the coating tends to lose contact wth the tantalum foil, so it may fall off and become ineffective. Another problem is ignition of the cathode. The cathode depends upon a cathode heater as a source for thermionic emission and for heating the mercury vapor in the cathode interior. Without a suitable heater which achieves thermionic emission, another appropriate ignition method must be employed. The control of emission has been a particular problem in hollow cathode neutralizers for ion thrusters. There has been a variation of the control characteristics with changes in beam current level, and there is a time variation of the control characteristics. These lead to control difficulties.

Harry J. King U.S. Pat. No. 3,515,932 discloses a different type of hollow cathode plasma generator. In the King patent an emissive coating is layered on the inside of the hollow cylinder of cathode 2 and a central tungsten heater coil 16 radiantly provides the heat to the emissive coating 14. The use of a filament type heater 16 is considered too fragile for ion sources for space thrusters. In other uses, an open tungsten wire heater 16 in the gas of the species to be ionized can only be used in cases where the gas is nonreactive with the heated tungsten wire. Furthermore, the phsycial spacing of the heated tungsten wire from the emissive material provides poor thermal coupling. Further, the quantity of the emissive material 14 that can be applied in the manner shown in the patent would appear to have a relatively short lifetime, when considering the lifetime needs of space thrusters and other long life electron sources.

SUMMARY

In order to aid understanding of this invention it can be stated in an essentially summary form that is directed to a dual discharge cathode having a barium impregnated cathode which is directly heated and is provided with a first anode so that pressure may be maintained around the barium impregnated cathode to prevent sputtering, with an opening in the first anode from which extends an electron bridge plasma plume into the main discharge chamber during operation. A main anode in the main discharge chamber causes ionization of low pressure gas therein to supply an ion beam from the main discharge chamber.

It is thus an object of this invention to provide a dual discharge cathode wherein the first discharge chamber operates at a high pressure to avoid sputtering. It is another object to provide a dual discharge cathode wherein a barium impregnated thermionic electron source is provided and is directly heated. It is another object to provide a barium impregnated electron source directly coupled to a potted heater, with the heater leads being away from the discharge chamber. It is a further object to provide a dual discharge cathode wherein the potentials applied in the first discharge chamber cause an electron bridge plasma plume to extend into the main discharge chamber.

Other objects and advantages of this invention will become apparent from a study of the following portion of this specification, the claims and the attached drawings.

DESCRIPTION OF THE PREFERRED EMBODIMENT

Figure 1:
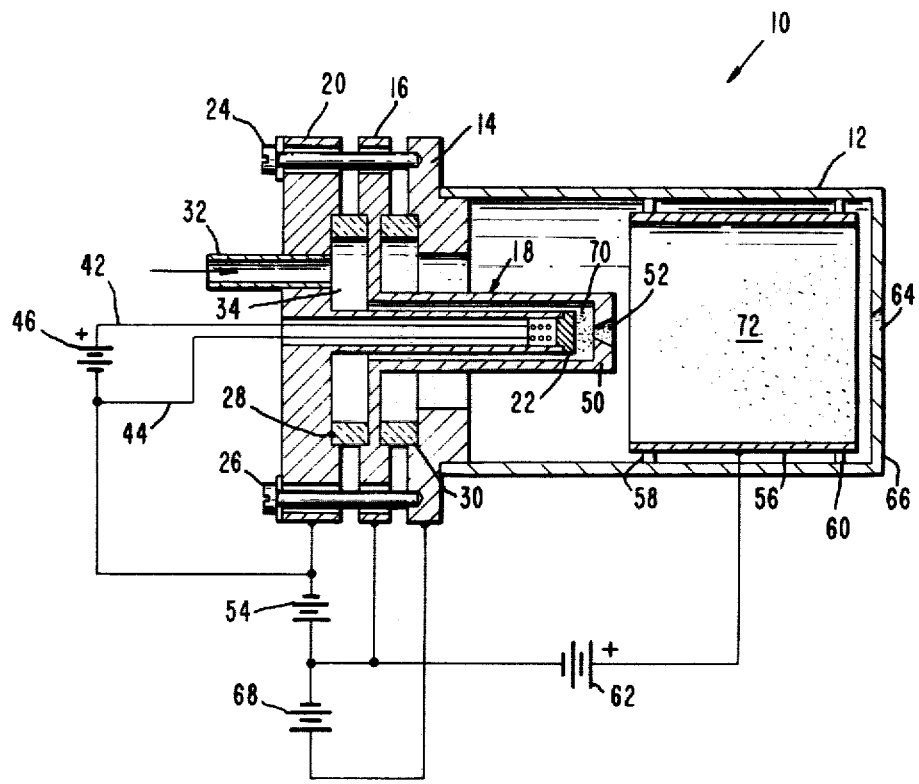
FIG. 1 is a longitudinal section through the dual discharge plasma device of this invention.
Figure 2:
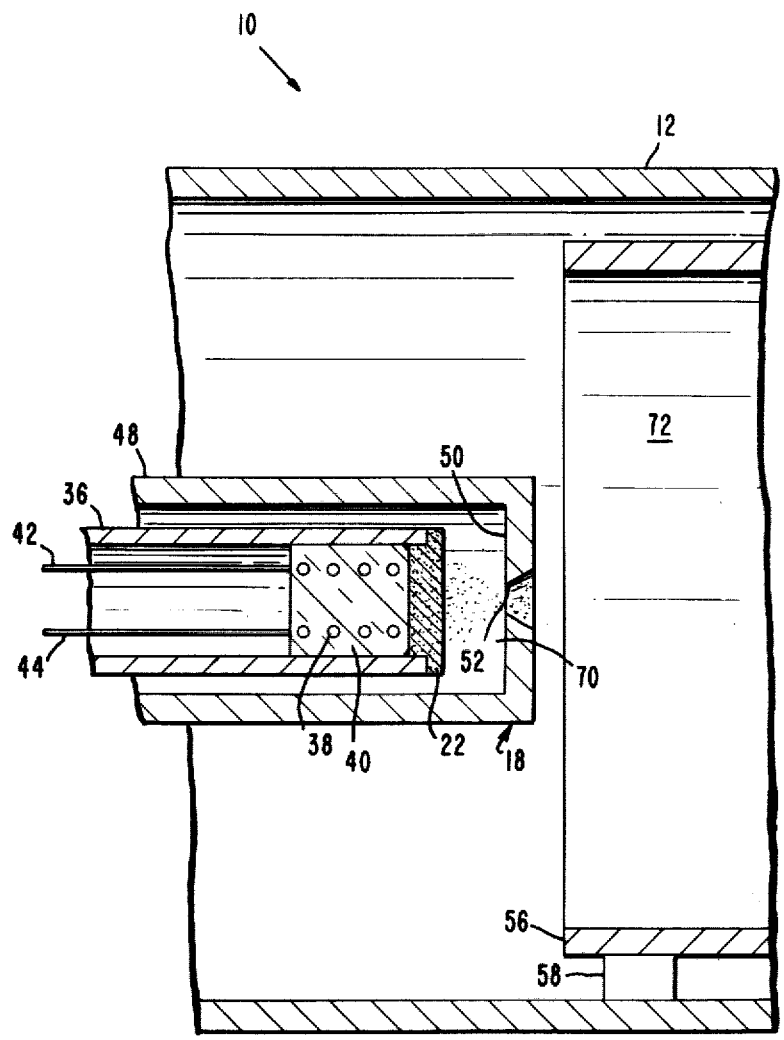
FIG. 2 is an enlarged view of the central portion of the structure of FIG. 1, with parts broken away.

The dual discharge plasma device of this invention is generally indicated at 10 in FIGS. 1 and 2. It comprises main discharge chamber housing 12 to which the balance of the dual discharge plasma device is secured. Flange 14 carries housing 12, flange 16 carries first anode 18 and flange 20 carries cathode 22, see FIG. 2. The flanges are secured together by clamp bolts 24 and 26 which are insulated from flanges 16 and 20. Furthermore, the flanges are separated from each other and insulated from each other by means of insulator rings 28 and 30.

Flange 20 is closed across the back and has connected therethrough gas inlet pipe 32 which supplies gas of the desired species to chamber 34.

Cathode tube 36 is secured to flange 20 and extends forward therefrom. On the front end it carries electric resistance heater 38 which is encapsulated in alumina body 40. Leads 42 and 44 extend from the heater through cathode tube 36, out of the left of flange 20 into the low pressure region around device 10. They are connected to a heater power supply, illustrated as battery 46. Cathode 22 is secured to the front of the cathode tube 36 in contact with the alumina body 40 of the heater.

Any electron source can be used as the cathode 22. A hot tungsten wire can be used in cases where the gas supply to be ionized is compatible with the hot tungsten wire. The specific preferred embodiment illustrated in FIGS. 1 and 2, uses barium impregnated in a porous sintered tungsten support to form the well known barium dispenser cathode.

Possible emissive materials include the emissive mixture of barium carbonate and strontium carbonate described in the background, lanthanum hexaboride and the emissive metals including cesium and barium. In each case these are mounted in a suitable support which usually does not enter into the emissive reaction. The illustrated cathode is a commercially available structure which is purchasable from Spectra-Mat Incorporated, Watsonvile, California 95076.

First anode 18 has anode tube 48 which extends forward from flange 16. Cap 50 on anode tube 48 has plasma discharge opening 52 therein. As seen in FIG. 1, flange 16 is connected to flange 20 through power supply 54 which is illustrated in the form of a battery which makes anode 18 positive with respect to cathode tube 36 and cathode 22 carried thereon.

Positioned within main discharge housing 12 and downstream from plasma discharge opening 52 is main anode 56. Main anode 56 is a cylindrical tube in the circular embodiment of FIG. 1 and is mounted on insulator supports 58 and 60 as well as such other supports as are required. Main anode 56 is connected to power supply 62 which is also connected to first anode 18, to make main anode 56 positive with respect to the first anode.

Main discharge housing 12 has an ion beam discharge opening 64 downstream from opening 52 beyond main anode 56. The main housing 12, including the housing face 66 is electrically biased with respect to first anode 18 by means of power supply 68 which is illustrated as a battery which makes the housing positive with respect to first anode 18.

In operation, electric resistance heater 38 is powered to heat electron emitter 22 to a normal operating temperature, about 1050° C. for the barium imprengnated porous tunsten primary electron source, and fuel gas is introduced through gas inlet pipe 32, chamber 34 into first discharge chamber 70. Any fuel gas which is nonreactive with respect to the barium impregnated electron emitter 22 can be employed. Typical compatible gases are mercury, noble gases and possibly high purity phosphorus and arsenic. Potential is applied between cathode tube 36 and first anode 18 so that cap 50 is about 10 volts positive with respect to electron emitter 22. The plasma discharge opening 52 is sufficiently small that with respect to the gas supply, the pressure in first discharge chamber 70 is about 1 torr. Under these circumstances a high pressure plasma discharge is formed. The electron emitter emits its normal current density, typically 1 ampere per square centimeter, at a normal operating temperature, with the barium primary electron source typically about 1050° C. Ion sputtering of the low work function barium coated electron emitter 22 is eliminated by reason of the low discharge voltage being below the sputtering voltage.

In this specific example the discharge voltage is 10 volts. One of the basic concepts of this invention is to have the voltage between the primary electron emitter, which in the preferred embodiment is illustrated as the barium impregnated tungsten cathode 22 but in the broad sense is any electron emitter, and its anode below the sputtering voltage of the primary electron source. This discharge is then used as a source of electrons for a more standard lower pressure higher voltage discharge in second discharge chamber 72.

A plume of plasma extends out of plasma discharge opening 52 into the second discharge chamber 72. This plume is caused by two separate drives. First, the cap 50 of the first anode is positive with respect to electron emitter 22 so that electron flow is toward the cap and toward plasma discharge opening 52. This is enough to cause the plume of plasma to extend out of discharge opening 52. Such a plume has been seen in a closed device which did not have a pressure differential across opening 52.

Second, in those structures where there is a higher pressure in first discharge chamber 70 as compared with to the second discharge chamber 72, then the gas flow helps carry the high pressure plasma out through plasma discharge opening 52 into second discharge chamber 72. However, this is a secondary effect which is not necessary to cause the plume discharge.

The second discharge chamber is at a much lower pressure, for example, one millitorr. Anode 56 is biased at about 40 volts positive with respect to first anode 18 so that a lower pressure higher discharge voltage plasma discharge ocurrs in the second discharge chamber 72.

The possibility that a tungsten filament might react with the supply gas provides a situation where the encapulated heater 38 coupled with the barium impregnated tungsten matrix would be useful. In addition, in the present structure the heating filament and its leads 42 and 44 are removed from the region of exposure of the supply gas and the plasma discharge to a region of high vacuum free of gas and discharge. This is the preferred embodiment, but other primary electron sources such as the heated tungsten wire can be employed in appropriate circumstances.

The biasing of first anode 18 positive with respect to cathode tube 36 at a voltage below the sputtering threshold not only overcomes the sputtering problems for the electron emitter 22 and its associated structure but extracts a plume of plasma from the first discharge chamber to the second discharge chamber. With main anode 56 biased at volts 40 positive with respect to cathode tube 18, with about a millitorr of gas pressure in the second discharge chamber 72, sputtering does take place in chamber 72 but the sputtering principally acts on the anode tube 48 and its cap 50, which are of sufficiently heavy material to withstand the sputtering and provide a long life. The plasma plume extending from plasma discharge opening 52 into second discharge chamber 72 provides an environment where the low pressure discharge in the second discharge chamber automatically starts up upon application of the bias potential.

The ion beam emitted from the ion beam discharge opening 64 is used for any conventional ion purpose. The cathode 10 can be employed as an ion source for ion implantation equipment so that the ion beam is subsequently analyzed, focussed and accellerated. The ion beam can be used for other industrial purposes, such as paint curing and can be used as an ion source for a space thruster.

This invention having been described in its preferred embodiment, it is clear that it is suceptible to numerous modifications and embodiments within the ability of those skilled in the art and without the exercise of the inventive faculty. Accordingly, the scope of this invention is defined by the scope of the following claims.

What is claimed is:

1. A dual discharge plasma device comprising:
an indirectly heated impregnated porous tungsten electron emitter directly mounted on an encapsulated electric heater;
a first anode adjacent said electron emitter and defining a first discharge chamber therebetween;
means for supplying fuel gas to be ionized to said first discharge chamber, an opening through said first anode from said first discharge chamber and means for applying positive potential to said first anode below sputtering threshold with respect to said electron emitter, said fuel gas supply means and said opening through said first anode from said first discharge chamber being such that sufficient fuel gas pressure is present in said first discharge chamber so that a non-sputtering fuel gas ionized plasma discharge takes place and a plume of the ionized fuel gas plasma extends out from said opening through said first anode;

a main anode;

a second discharge chamber between said first anode and said main anode, a power supply connected to said main anode and to said first anode to make said main anode positive with respect to said first anode so that a low pressure ionized fuel gas plasma discharge coupled to the ionized fuel gas plasma discharge in said first discharge chamber takes place in said second discharge chamber.

2. The dual discharge plasma device of claim 1 wherein said electron emitter is a barium impregnated porous tungsten emitter.

3. The dual discharge plasma device of claim 2 wherein said heater is mounted on a cathode tube and the electric power supply leads to said electric heater extend through the interior of said cathode tube, the gas supply means being exterior to said cathode tube so that said leads are isolated from the supply gas.

4. The dual discharge plasma device of claim 3 wherein there is an ion beam discharge opening from said second discharge chamber so that an ion beam can be supplied therefrom.

5. The duel discharge plasma device of claim 1 wherein there is an ion beam discharge opening from said second discharge chamber so that an ion beam can be supplied therefrom.

6. The dual discharge plasma device of claim 5 wherein said heater is mounted on a cathode tube and the electric power supply leads to said electric heater extend through the interior of said cathode tube, the fuel gas supply means being exterior to said cathode tube so said leads are isolated from the supply of fuel gas.

7. A plasma device comprising:

a first discharge chamber;

an indirectly heated primary electron source within said first discharge chamber;

an anode within said first discharge chamber;

means for supplying to said first discharge chamber only fuel gas to be ionized;

means connected to said electron source and said anode from energizing said electron source to act as a cathode, said means for supplying only fuel gas to be ionized to said first discharge chamber providing a sufficient pressure in said first discharge chamber to produce an ionized fuel gas plasma with the plasma discharge voltage below sputtering voltage of said indirectly heated electron source;

an opening from said first discharge chamber for discharging a plume of ionized fuel gas including electrons from said first discharge chamber, said opening being sufficiently small to maintain the pressure in said first discharge chamber above sputtering threshold; and a second discharge chamber connected to said first discharge chamber, said opening from said first discharge chamber being connected to said second discharge chamber so that a plasma plume extends from said first discharge chamber into said second discharge chamber for producing a coupled plasma.

8. The plasma device of claim 7 wherein said electron source is a low work function electron emissive source.

9. The plasma device of claim 8 wherein said low work function emissive material is supported on a heated support.

10. The method of producing a nonsputtering plasma in a first discharge chamber having an electron source therein, having an opening from the first discharge chamber and having an anode adjacent the opening together with a second discharge chamber beyond the opening from the first discharge chamber and a second anode in the second discharge chamber, comprising the steps of;

supplying only fuel gas to the first discharge chamber with sufficient flow that in view of the opening from the first discharge chamber sufficient pressure is maintained in said first discharge chamber so that the plasma discharge voltage which produces a plasma in the gas is below the sputtering threshold of the electron source;

applying a potential between the electron source and the anode sufficient to produce a plasma therebetween with the anode positive with respect to the electron source and with the plasma discharge voltage below the sputtering threshold voltage of the electron source to produce a plasma in the first discharge chamber with a plasma plume extended out of the opening from the first discharge chamber;

providing gas into the second discharge chamber by flow only out of the opening from the first discharge chamber so that the second discharge chamber is at a lower pressure than the first discharge chamber;

applying a potential between the second anode and the anode with the second anode positive with respect to the anode sufficiently to produce a plasma in the second discharge chamber which is coupled to the plasma plume.

* * * * *